US008686470B2

(12) United States Patent
Ritter

(10) Patent No.: US 8,686,470 B2
(45) Date of Patent: Apr. 1, 2014

(54) ESD PROTECTION CIRCUIT

(75) Inventor: Hans-Martin Ritter, Nahe (DE)

(73) Assignee: NXP, B.V., Eindhoven (NL)

( * ) Notice: Subject to any disclaimer, the term of this patent is extended or adjusted under 35 U.S.C. 154(b) by 177 days.

(21) Appl. No.: 12/986,970

(22) Filed: Jan. 7, 2011

(65) Prior Publication Data

US 2012/0175672 A1 Jul. 12, 2012

(51) Int. Cl.
*H01L 29/49* (2006.01)
(52) U.S. Cl.
USPC ........... 257/154; 257/124; 257/173; 257/372; 257/601; 257/E29.327
(58) Field of Classification Search
USPC ......... 257/107, 112, 124, 154, 173, 355, 372, 257/601, E29.327, E29.337
See application file for complete search history.

(56) References Cited

U.S. PATENT DOCUMENTS

| RE38,608 E | 10/2004 | Yu et al. | |
|---|---|---|---|
| 2002/0017654 A1* | 2/2002 | Lee et al. ................. | 257/173 |
| 2005/0083618 A1 | 4/2005 | Steinhoff | |
| 2009/0090972 A1* | 4/2009 | Vinson ..................... | 257/355 |
| 2009/0213506 A1 | 8/2009 | Zhan et al. | |
| 2009/0268361 A1 | 10/2009 | Mallikarjunaswamy | |
| 2012/0104459 A1* | 5/2012 | Huang ..................... | 257/173 |

FOREIGN PATENT DOCUMENTS

EP  1 482 554 A1  12/2004

OTHER PUBLICATIONS

"Extended European Search Report." Apr. 27, 2012 for European Application No. 12150305.6.
Ming-Dou Ker, et al.: "Overview of On-Chip Electrostatic Discharge Protection Design with SCR-Based Devices in CMOS Integrated Circuits," IEEE Transactions on Device and Materials Reliability, vol. 5, No. 2, pp. 235-249 (Jun. 2005).
RClamp2504N & RClamp3304N, RailClamp 2.5V & 3.3V TVS Arrays, Semtech Corporation, www.semtech.com pp. 1-11 (Jan. 15, 2008).
BZT52H Series Single Zener Diodes in a SOD123F Package, Rev. 3, Internet Citation: http://www.nxp.com/documents/data_sheet/BZT52H_SER.pdf, NXP B.V., pp. 1-13, (Dec. 7, 2010).

* cited by examiner

*Primary Examiner* — Matthew E Warren

(57) ABSTRACT

An integrated circuit device provides electrostatic discharge (ESD) protection. In connection with various example embodiments, an ESD protection circuit includes a diode-type circuit having a p-n junction that exhibits a low break-down voltage. Connected in series with the diode between an internal node susceptible to an ESD pulse and ground, are regions of opposite polarity having junctions therebetween for mitigating the passage of leakage current via voltage sharing with the diode's junction. Upon reaching the break-down voltage, the diode shunts current to ground via another substrate region, bypassing one or more junctions of the regions of opposite polarity and facilitating a low clamping voltage.

23 Claims, 11 Drawing Sheets

ESD PROTECTION CIRCUIT

BACKGROUND

Modern electronic equipment, and in particular handheld equipment, is often used in harsh environments in which the equipment is subjected to potential electrostatic discharge (ESD). For instance, data exchange ports such as those employed with universal serial bus (USB) or high-definition multimedia interface (HDMI) receiver/transceiver circuits are directly connected to external pins of electronic equipment. Current pulses from electrostatic discharge can have extremely fast rising slopes, such that protecting against such pulses requires rapid switching in order to shunt the current. In many instances, circuits are not robust enough to withstand the stress caused by ESD.

To address these problems, a variety of different types of ESD protection devices have been used, often implemented on a printed circuit board between external contacts and the integrated circuit of the device being protected. Such ESD protection devices generally shunt excessive currents to ground and clamp stress voltages to a level that the circuit to be protected can withstand. If the constraints on parasitic capacitance of the protection device are not stringent, simple p-n-junction diodes have been used.

If parasitic capacitance is desirably low (e.g., in order to not disturb high data rate signals), rail-to-rail or similar types of devices have been used. In such devices, two small steering diodes with small capacitance are often used for each channel, to shunt the stress current either to ground or to a large clamping device that shunts current further to ground while achieving a standoff voltage. Such clamping devices may include a simple diode or a more complex device, such as those in which a simple diode is used as a triggering component. The standoff voltage and the clamping voltage of the clamping device define the possible application.

The leakage current of the protection device at the standoff voltage (usually the supply voltage of the IC to be protected plus a safety offset) is desirably low where power consumption is a concern. Generally, the clamping voltage has to be kept lower than the acceptable voltage of the integrated circuit in which the device is used. Modern integrated circuits, however, have ever decreasing supply voltages and are more susceptible to high clamp voltages. Diode-based ESD devices often do not break down or otherwise operate satisfactorily at low operating voltages (e.g., below 6V). Other ESD devices can be difficult to manufacture in conjunction with standard integrated circuit processes.

Accordingly, achieving robust clamping while operating at low power has been challenging for a variety of circuits and ESD applications. These and other matters have presented challenges to ESD circuit protection, and related device operation.

SUMMARY

Various example embodiments are directed to electrostatic discharge (ESD) protection for a variety of devices.

In connection with an example embodiment, an electrostatic discharge (ESD) circuit includes a plurality of regions of opposite polarity sharing p-n junctions therebetween, the regions including an input region connected to an internal node susceptible to ESD pulses, an output region connected to ground, and at least one region in series between the input and output regions. An underlying doped region is adjacent one of the plurality of regions and, in response to a breakdown voltage at one of the junctions, shunts current between the input region and the output region, bypassing p-n junctions of the regions between the input and output regions.

Another example embodiment is directed to an electrostatic discharge (ESD) circuit having a doped collector region in a substrate, two base regions in the collector region and separated from one another, and two emitter regions in each base region. The base regions are doped to a polarity that is opposite the polarity of the collector region, and the emitter regions are doped to the polarity of the collector region. The emitter regions include an input emitter in one of the base regions and connected to an input pin, and a grounded emitter in the other one of the base regions and connected to ground. An interconnect directly connects the emitter regions that are not connected to the input pin or to ground.

Another example embodiment is directed to an ESD circuit for discharging current from an input node susceptible to ESD pulses. The circuit includes a doped substrate, a diode circuit in the doped substrate and having a threshold breakdown voltage, a plurality of doped regions and a thyristor. The plurality of doped regions are of opposite polarity and form p-n junctions connected in series with the diode between the input node and ground. The diode and plurality of doped regions pass a leakage current between the input node and ground at voltage levels below the threshold breakdown voltage. The thyristor includes a portion of the doped substrate and shunts current from the input node to ground, bypassing at least some of the plurality of doped regions, in response to the diode circuit breaking down.

The above discussion is not intended to describe each embodiment or every implementation of the present disclosure. The figures and following description also exemplify various embodiments.

FIGURES

Various example embodiments may be more completely understood in consideration of the following detailed description in connection with the accompanying drawings, in which.

Figure 1:
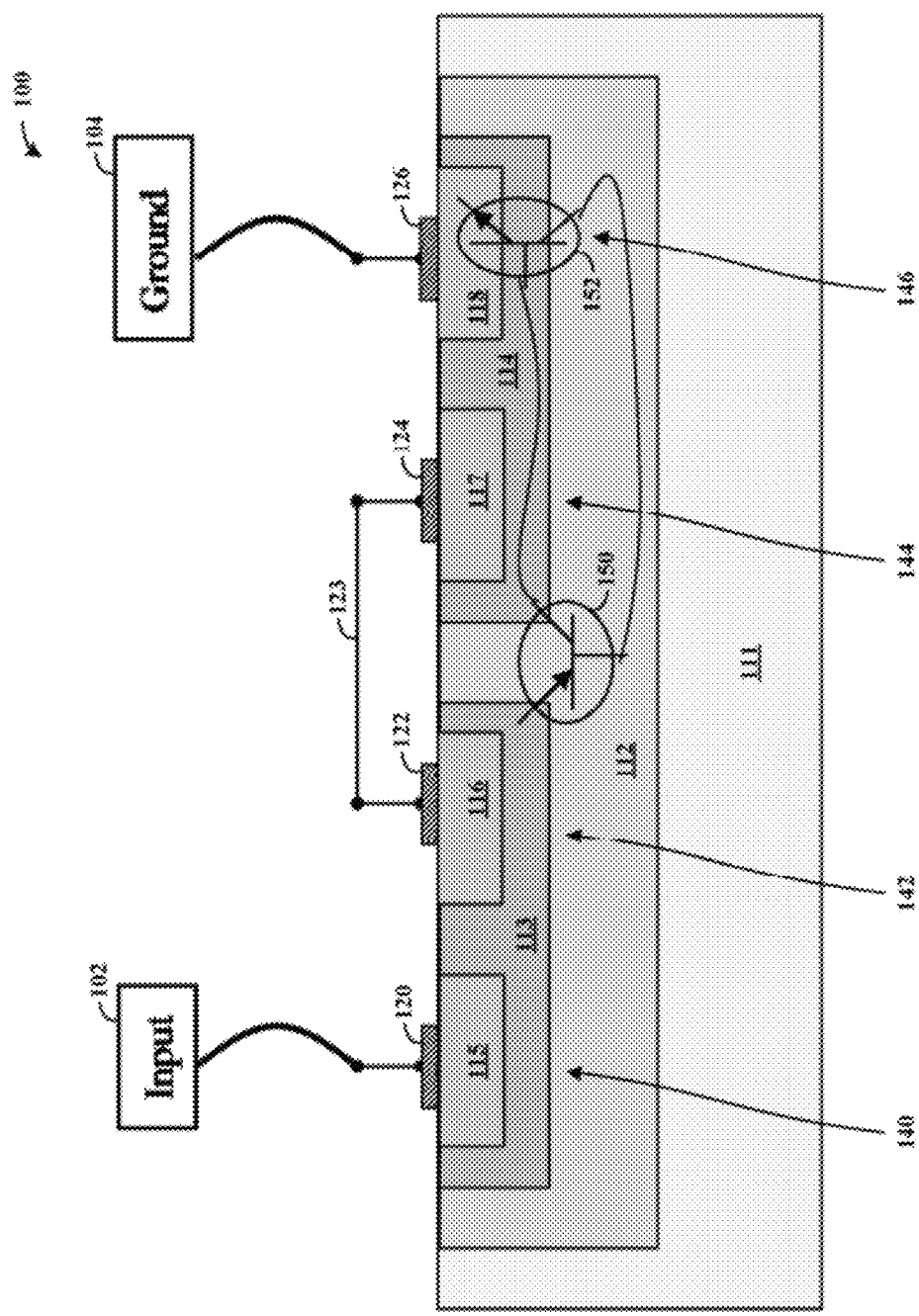
FIG. 1 shows a cross-section of a thyristor-based diode circuit for ESD protection, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION

The present invention is believed to be applicable to a variety of different types of processes, devices and arrangements for use with various circuits, including integrated circuits susceptible to electrostatic discharge (ESD), and related processes. While the present invention is not necessarily so limited, various aspects of the invention may be appreciated through a discussion of examples using this context.

According to an example embodiment, an ESD circuit includes multiple regions of opposite polarity configured to flow current in different current paths during an ESD event and under conditions in which an ESD event is not occurring. Under normal (non-ESD) conditions, the circuit flows current through a series of emitters separated from one another by base regions having a polarity that is opposite the polarity of the emitters. The current flows from a first (input) emitter in the series of emitters, to a last (grounded) emitter that is connected to ground. By flowing current through the respective junctions in series, the leakage of the overall circuit is limited by the leakage at one of the junctions.

When an ESD event occurs, current flows from the input emitter, into a base region that forms a junction with the emitter, and into an underlying collector. From the collector, the current flows into the base region adjacent the grounded emitter, and to ground via the grounded emitter. This ESD event current path facilitates a low-resistance path to shunt current from input to ground, which triggers with the triggering at the p-n junction between the input emitter and the base region adjacent thereto.

In connection with other example embodiments, a plurality of regions of opposite polarity having junctions therebetween are arranged in series between an internal node and ground, to mitigate the flow of leakage current in a below-threshold operating state, with one of the regions forming part of a p-n junction that breaks down at low voltage for shunting an ESD pulse to ground via an underlying substrate. For example, a p-n junction having a low breakdown voltage (e.g., 3 or 4 V) is used for shunting current as above, with additional p-n junctions arranged in series therewith to mitigate high leakage current to which the low-breakdown junction is susceptible. The opposite regions and corresponding junctions are configured such that an externally applied voltage is shared between the junctions in series, so that each junction withstands half of the applied voltage. As the leakage current decreases exponentially with lowered voltage, the leakage current is drastically reduced accordingly.

To mitigate corresponding effects of increased clamping voltage, the aforesaid junction being used to conduct current under an ESD condition is used to limit the clamping voltage of the device to the clamping voltage of the junction plus a relatively small clamping voltage of a thyristor formed in series with the junction via the underlying substrate.

Turning now to the Figures, FIG. 1 shows a cross-section of a thyristor-based diode ESD protection circuit 100, according to another example embodiment of the present invention. The circuit 100 is configured to pass current between an input 102, such as an internal VDD, and ground 104. The circuit 100 includes a substrate having multiple doped regions of opposite polarity, each region being doped relative to the others to suit particular applications. A region 111 of the substrate is doped to a first polarity, a collector 112 is doped to an opposite polarity. Two base diffusion regions 113 and 114 are formed in the collector 112 and doped to the first polarity. Within each of the base diffusion regions 113 and 114 is a pair of emitter regions, including emitter regions 115 and 116 in base diffusion region 113, and emitter regions 117 and 118 in base diffusion region 114. The respective emitter regions are doped to a polarity that is opposite that of the base diffusion regions. The collector 112 and the base diffusion regions 113 and 114 are left floating (e.g., they are not electrically connected to another potential).

Contacts are respectively made to the input 102 and ground 104 at an input emitter contact 120 and an output/grounded emitter contact 126, which are respectively connected to input emitter region 115 and a grounded emitter region 118. Contacts 122 and 124 are connected/shorted to one another via interconnect 123 and respectively connected to emitter regions 116 and 117.

For readability, the following discussion is made in the context of a particular doping approach in which the substrate 111 is p-doped substrate, the collector 112 is n-doped, base regions 113/114 are p-doped, and emitter regions 115-118 are n-doped. However, it is to be understood that different doping can be used to achieve a similar result, with an appropriate arrangement of the doped regions.

If a relatively low positive voltage is applied to the input 102 (e.g., 3V), the first emitter 115 is reverse biased to its base 113, and the third emitter 117 is reverse biased to its base 114, with the bias voltage being slightly smaller than half of the external applied voltage of 3V. The leakage current of each of these junctions is low (e.g., about 30 nA). The junctions are connected in series, so the total leakage current is similar to the leakage current of one of the junctions. The leakage current flows from the input 102, to the input emitter 115 via contact 120, to its base 113, to emitter 116, and into emitter 117 though contact 122, interconnect 123 and contact 124. From the emitter 117, the leakage current flows through the base 114 and into the output/grounded emitter 118, and to ground via contact 126.

Under an ESD condition in which the voltage at the input 102 rises (e.g., exceeds a trigger voltage), ESD current flows from the input 102 via contact 120 into the input emitter 115, and then into the base region 113 that forms a junction with the emitter. From the base regions 113, the ESD current flows into the underlying collector 112 and into the base region 114 via an effective bipolar junction transistor 150. The current flows via base region 114 and collector 112 to emitter 118 via an effective bipolar junction transistor 152, and therein to ground 104 via contact 126. Accordingly, in response to the trigger voltage an intrinsic thyristor including the base region 113, collector region 112, base region 114 and emitter region 118 (e.g., p-n-p-n) switches into its low resistance state. This ESD event current path facilitates a low-resistance path to shunt current from input to ground, which triggers with the triggering at the p-n junction between the input emitter 115 and the base region 113.

The trigger voltage is set or implemented, based upon the application. For example, the doping concentration of the various regions as shown in FIG. 1 can be altered to suit different applications, and may set characteristics of the device 100 including breakdown and leakage as discussed herein. The voltages and currents described above are thus exemplary, with the understanding that different values may be achieved to suit different applications.

Figure 2:
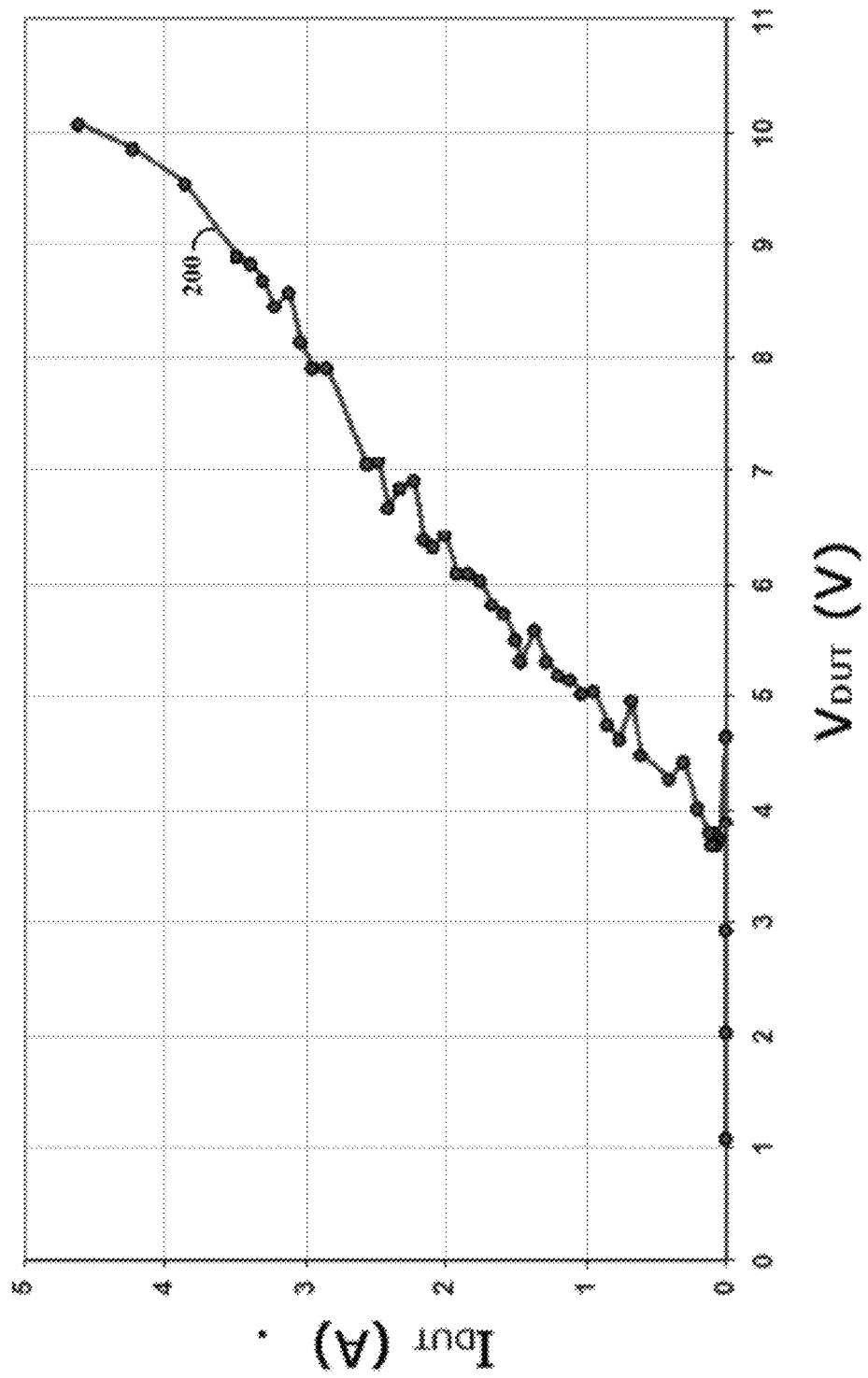
FIG. 2 shows a plot characterizing the operation of a thyristor-based diode circuit for ESD protection, according to another example embodiment of the present invention.

FIG. 2 shows a plot 200 characterizing the operation of a thyristor-based diode circuit for ESD protection, according to another example embodiment of the present invention. The plot 200 shows a transmission line pulse (TLP) with a 100 ns length, with a 3.7 V device holding voltage, and leakage current at 3 V reverse bias of 30 nA. The increase in current is shown as the voltage increases beyond the holding voltage, with voltage on the horizontal axis and current on the vertical axis.

Figure 3:
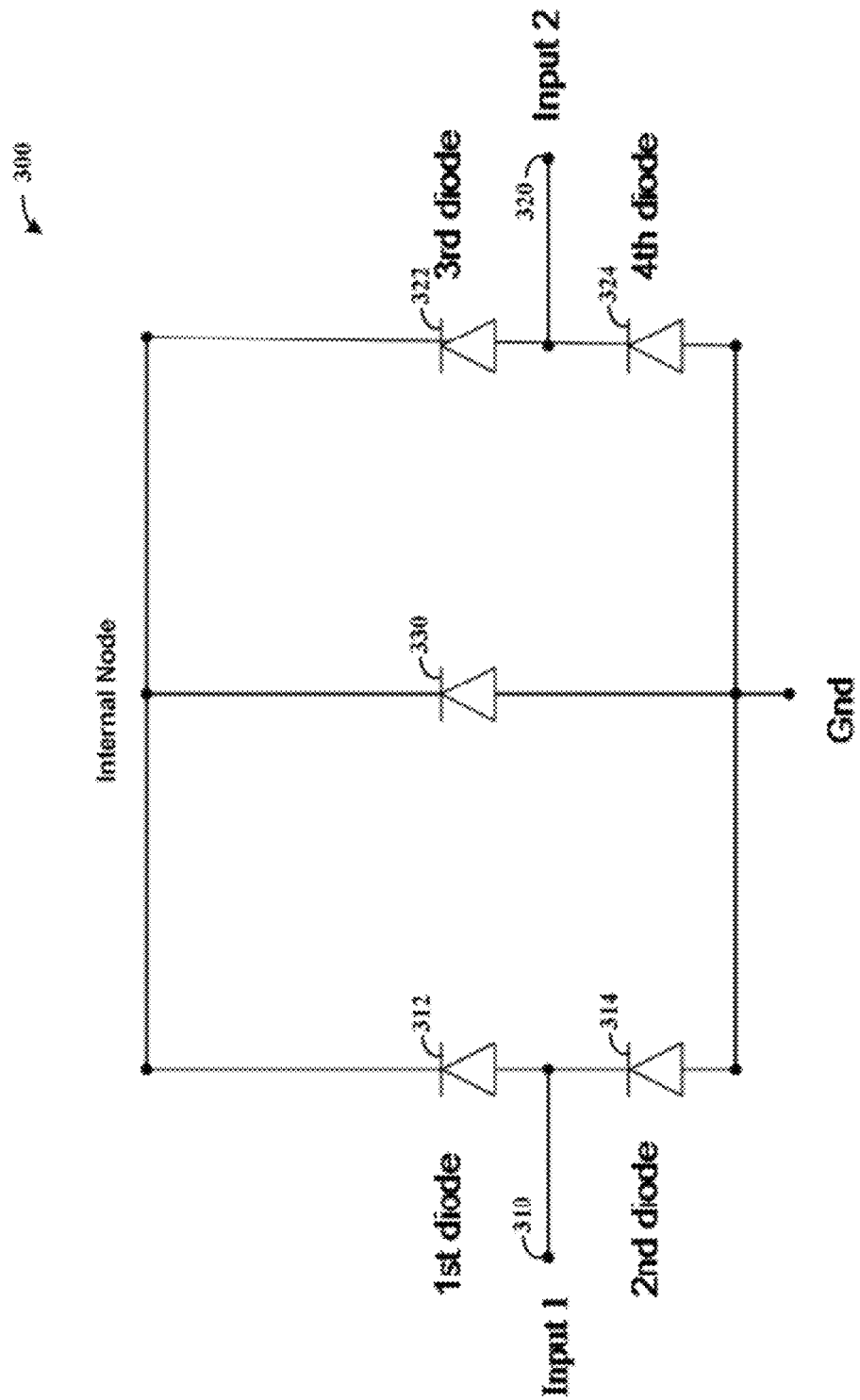
FIG. 3 shows a multi-channel thyristor-based diode circuit, according to another example embodiment of the present invention.

FIG. 3 shows a multi-channel thyristor-based diode circuit 300, according to another example embodiment of the present invention. The circuit 300 is configured for use with two inputs at nodes 310 and 320, and may be applicable to use with one node, or more than two nodes. This applicability is also consistent with the example embodiments shown in FIGS. 4-7 and discussed further below. For each input node, two diodes are connected thereto, including a diode (312, 322) having its anode connected to the input node and its cathode to an internal node (e.g., VDD), and another diode (314, 324) having its anode connected to ground and its cathode to the input node.

The diode circuit 330 is configured for operation in accordance with one or more embodiments as described herein, for providing (with circuitry coupled as shown) alternating regions of opposite polarity that mitigate leakage current below a threshold voltage, with a breakdown voltage that permits the discharge of current from the internal node to ground at a relatively low clamping voltage. As shown, the circuit 300 is applicable to multi-channel (e.g., two channel) rail-to-rail protection with desirable holding voltage (e.g., 4 V) and low leakage (e.g., at 3 V). In some implementations, all diodes are integrated on one chip, with the steering diodes realized using the diffusions that are used for building the diode 330.

Figure 4:
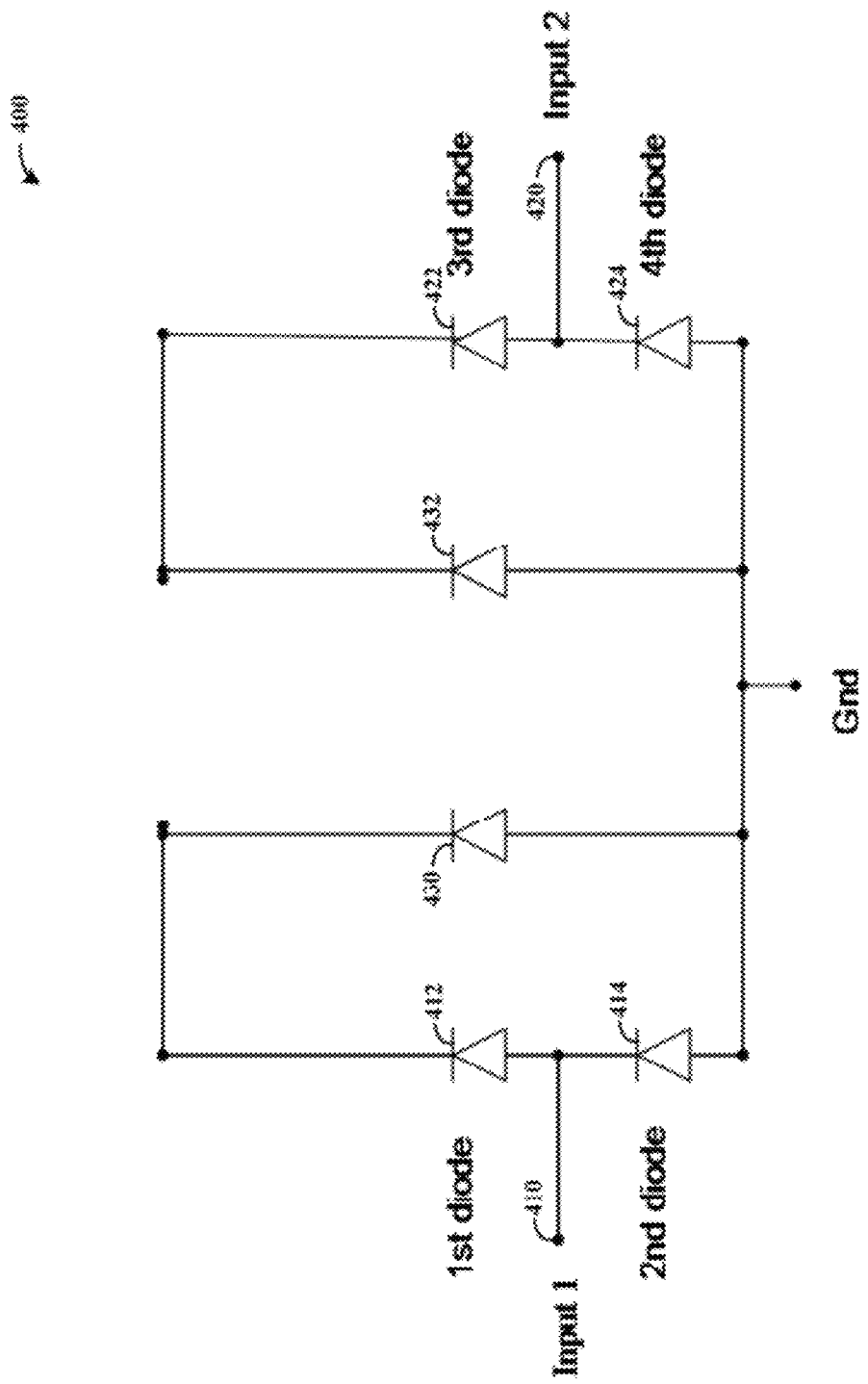
FIG. 4 shows a multi-channel thyristor-based diode circuit with channel-specific diodes, according to another example embodiment of the present invention.

FIG. 4 shows a multi-channel thyristor-based diode circuit 400 with channel-specific diodes, according to another example embodiment of the present invention. Similar to FIG. 3, the circuit 400 includes two diodes for each input node, including diodes 412 and 414 for node 410, and diodes 422 and 424 for node 420. Diode circuits 430 and 432 are configured for operation in accordance with one or more embodiments as described herein, for providing alternating regions of opposite polarity that mitigate leakage current below a threshold voltage, and to exhibit a breakdown voltage that permits the discharge of current from the internal node to ground at a relatively low clamping voltage. The circuit 400 is applicable to multi-channel (e.g., two channel) rail-to-rail protection with desirable holding voltage (e.g., 4 V) and low leakage (e.g., at 3 V), with an exclusive diode (430, 432) for each channel.

Figure 5:
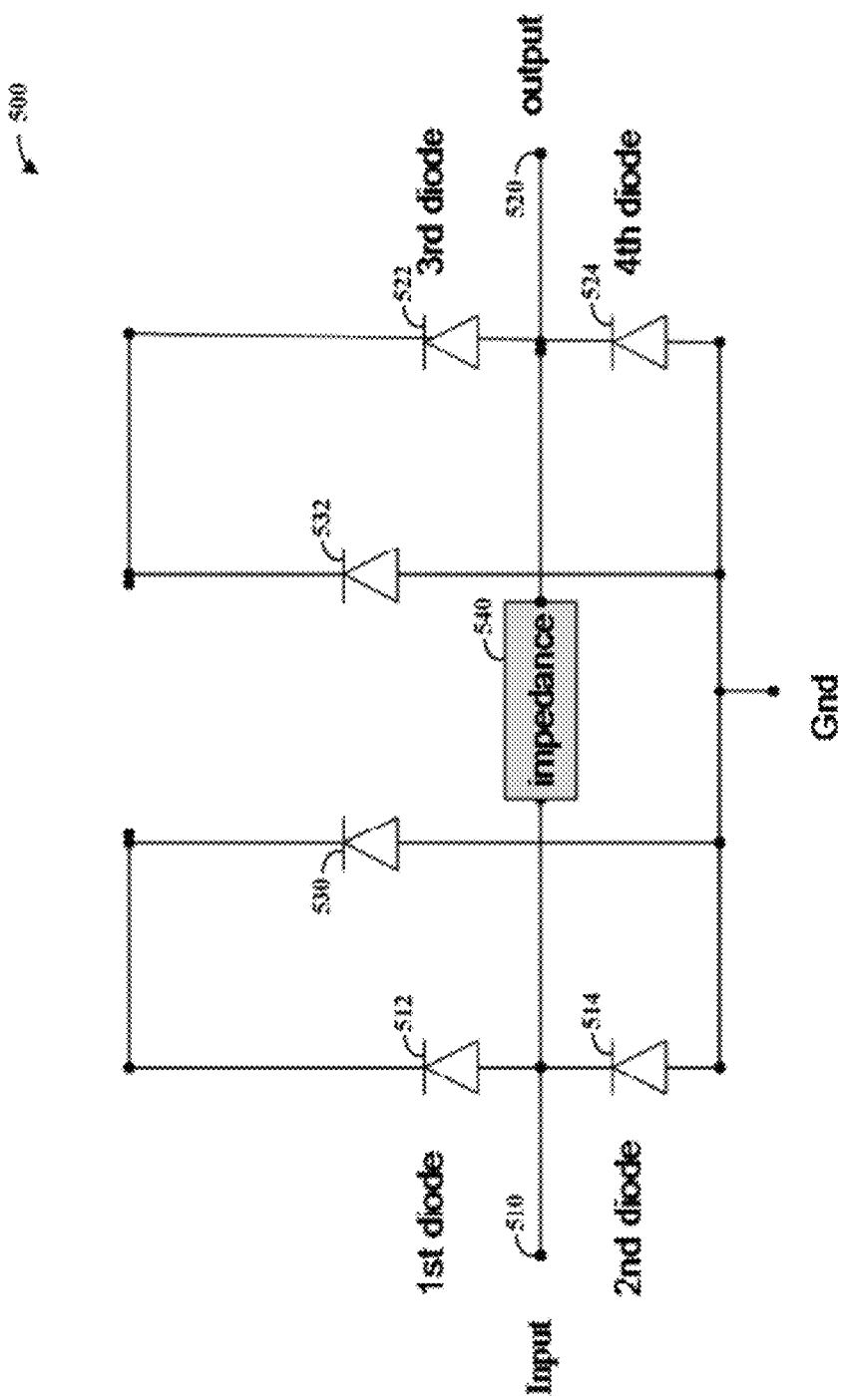
FIG. 5 shows a two-stage thyristor-based diode circuit for ESD protection, according to another example embodiment of the present invention.

FIG. 5 shows a two-stage thyristor-based diode circuit 500 for ESD protection, according to another example embodiment of the present invention. The circuit 500 is applicable to both single-channel and multi-channel two-stage protection, with the embodiment shown characterizing one channel with input node 510 and output node 520, and having an impedance 540 (or impedance network) therebetween. Similar to the input nodes 310 and 320, each of the input and output nodes 510 and 520 are connected to the anode of a diode connected between the nodes and an internal node, and to the cathode of a diode connected between ground and the nodes. Diodes 530 and 532 are similar in function to diode 330, to facilitate both the mitigation of leakage current and a low breakdown voltage in respective operating states.

Figure 6:
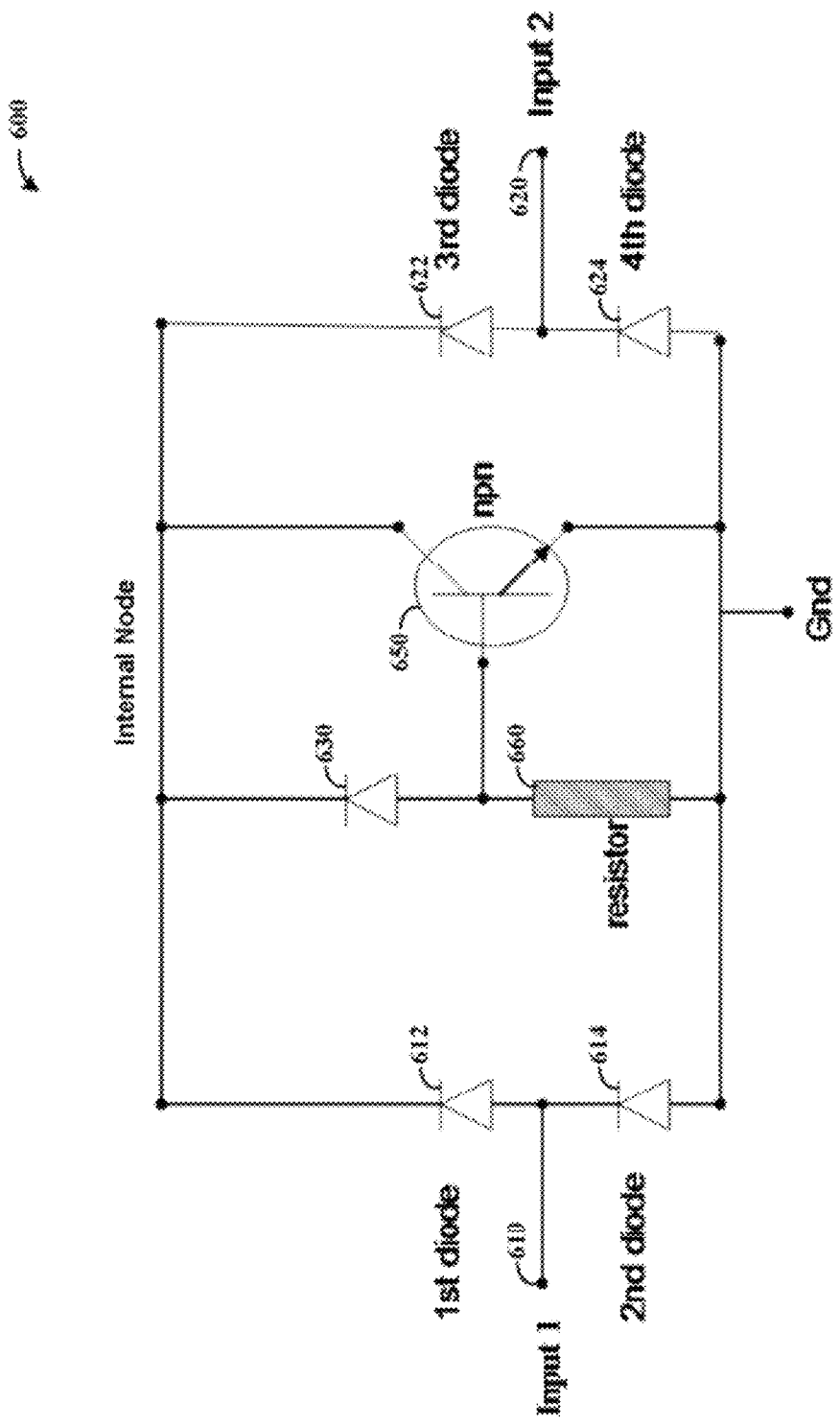
FIG. 6 shows a thyristor-based diode circuit with a diode-triggered bipolar transistor clamping circuit, according to another example embodiment of the present invention.

FIG. 6 shows a thyristor-based diode circuit 600 with a diode-triggered bipolar transistor clamping circuit 650, 660, according to another example embodiment of the present invention. The circuit 600 is similar to the circuit shown in FIG. 3, with input nodes 610 and 620 corresponding to input nodes 310 and 320, and diodes 612, 614, 622 and 624 correspond thereto.

Diode 630 is similar to diode 330, exhibiting a low breakdown voltage and connected (as shown) to mitigate leakage below the breakdown voltage. The clamping circuit includes a bipolar junction transistor 650 and a resistor 660, connected between an internal node and ground as shown. When the breakdown voltage is achieved, the clamping circuit turns on and shunts current accordingly.

Figure 7:
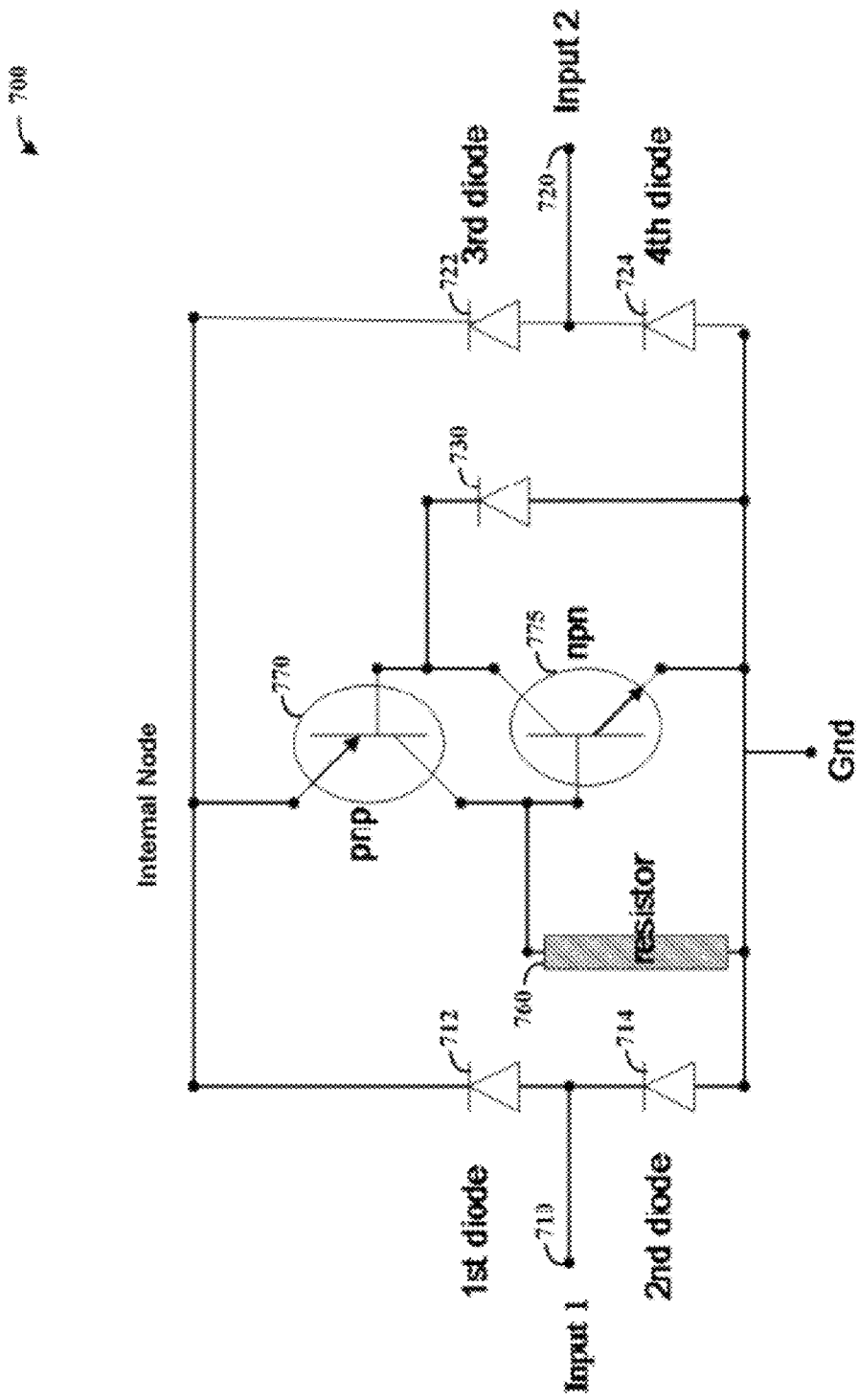
FIG. 7 shows a thyristor-based diode circuit with a diode-triggered silicon-controlled rectifier (SCR) clamping circuit, according to another example embodiment of the present invention.

FIG. 7 shows a thyristor-based diode circuit 700 with a diode-triggered silicon-controlled rectifier (SCR) clamping circuit, according to another example embodiment of the present invention. As with the circuit 600 in FIG. 6, the circuit 700 is similar to the circuit 300 in FIG. 3, with respect to input nodes 710 and 720, and corresponding diodes 712, 714, 722 and 724. Diode 730 is similar to diode 330, exhibiting low breakdown voltage and connected to mitigate leakage below the breakdown voltage. The circuit 700 is connected to two channels for rail-to-rail protection, with the diode 730 being configured to trigger a silicon-controlled rectifier circuit including bipolar transistors 770 and 775, as well as resistor 760.

Figure 8:
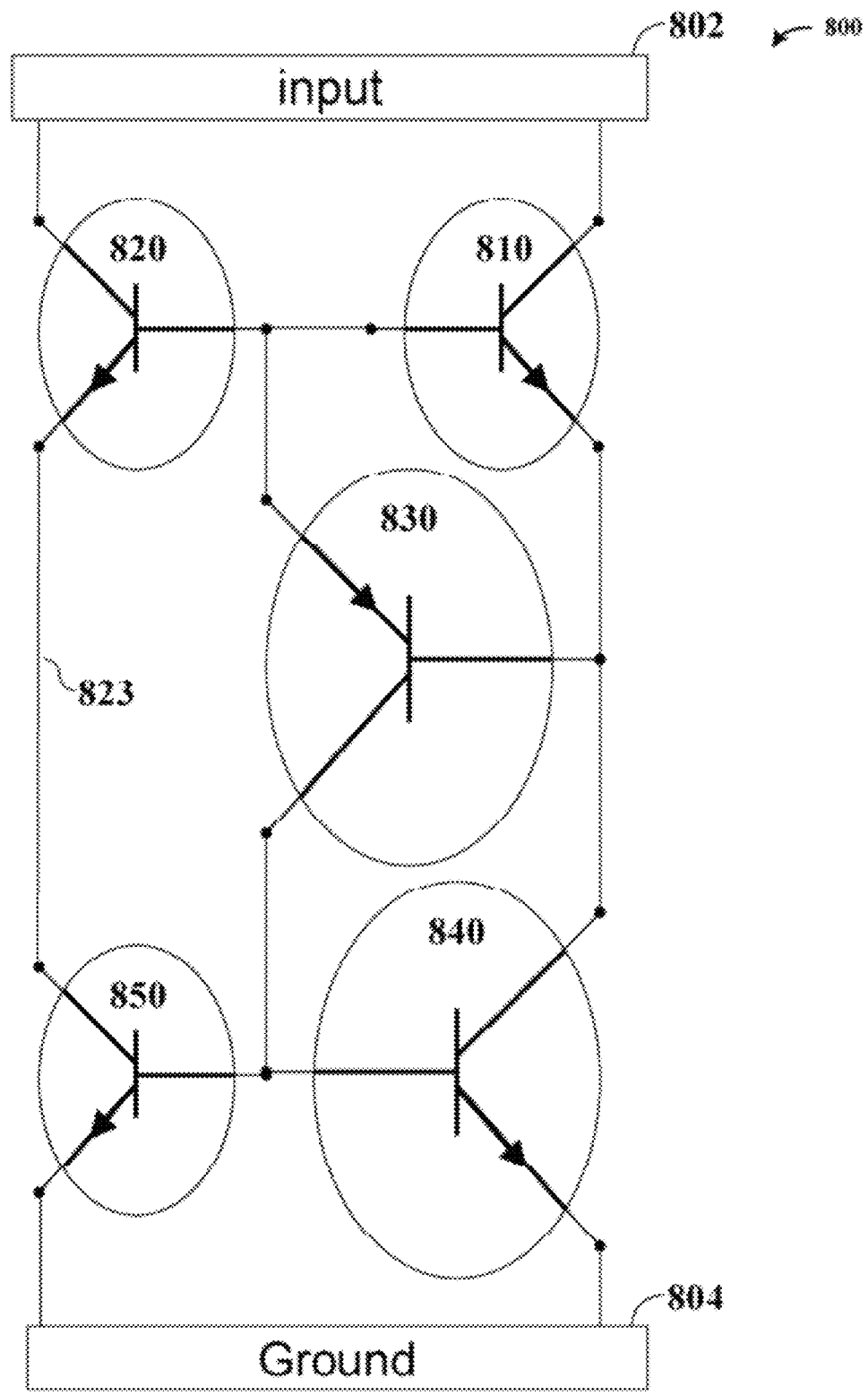
FIG. 8 shows a circuit diagram of an ESD circuit, according to another example embodiment of the present invention.

FIG. 8 shows an ESD circuit 800, according to another example embodiment of the present invention. The circuit 800 includes a plurality of regions of opposite polarity that form bipolar junction transistors connected between an input node 802 and ground 804. The transistors include n-p-n transistors 810 and 820 connected to an input region at the input node 802. The base of n-p-n transistor 820 and the base of n-p-n transistor 810 are connected to the emitter of p-n-p transistor 830, which is connected via its base to the collector of n-p-n transistor 840 and to the emitter of n-p-n transistor 810. The emitter of n-p-n transistor 820 is connected to the collector of n-p-n transistor 850. The bases of n-p-n transistors 840 and 850 are both connected to the collector of p-n-p transistor 830. The emitters of n-p-n transistors 840 and 850 are both connected to ground 804.

In some embodiments, the ESD circuit 800 is implemented using a thyristor-based diode circuit as shown in FIG. 1. In these embodiments, the transistors are formed as follows. The collector 112 forms the emitter of transistor 810, the base of transistor 830 and the emitter of transistor 840. Base diffusion 113 forms the base of transistors 810 and 820, and the emitter of transistor 830. Base diffusion 114 forms the collector of transistor 830, and the base of transistors 840 and 850. The emitter 115 forms the collector of transistors 810 and 820. Emitter 116 forms the emitter of transistor 820, and is connected via conductor 823 (respectively 123 in FIG. 1) to emitter 117, which forms the collector of transistor 850. Emitter 118 forms the emitter of transistors 840 and 850.

Figure 9:
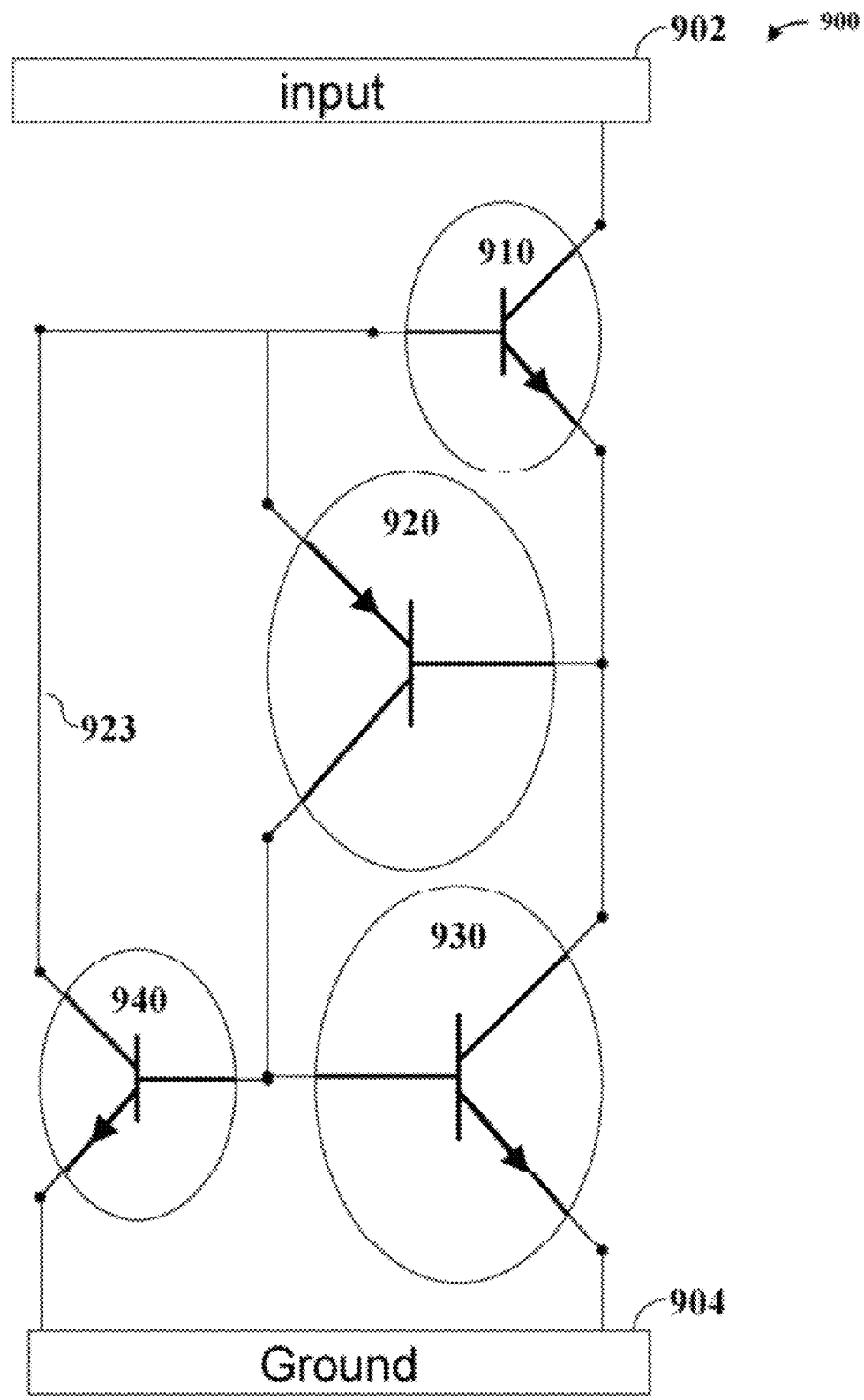
FIG. 9 shows another circuit diagram of an ESD circuit, according to another example embodiment of the present invention.

FIG. 9 shows an ESD circuit 900, according to another example embodiment of the present invention. The circuit 900 includes transistors 910, 920, 930 and 940 connected between an input node 902 and ground 904 as shown, with the base of transistor 910 connected to the collector of transistor 940 via conductor 923. The circuit 900 may be formed using a thyristor-based diode circuit similar to the circuit 100 shown in FIG. 1, with emitter 116 removed. In such an embodiment, the collector 112 forms the emitter of transistor 910, the base of transistor 920 and the collector of transistor 930. Base diffusion 113 forms the base of transistor 910 and the emitter of transistor 920. Base diffusion 114 forms the collector of transistor 920 and the base of transistors 930 and 940. The emitter 115 forms the collector of transistor 910, and emitter 117 forms the collector of transistor 940. Emitter 118 forms the emitter of transistors 930 and 940.

Figure 10:
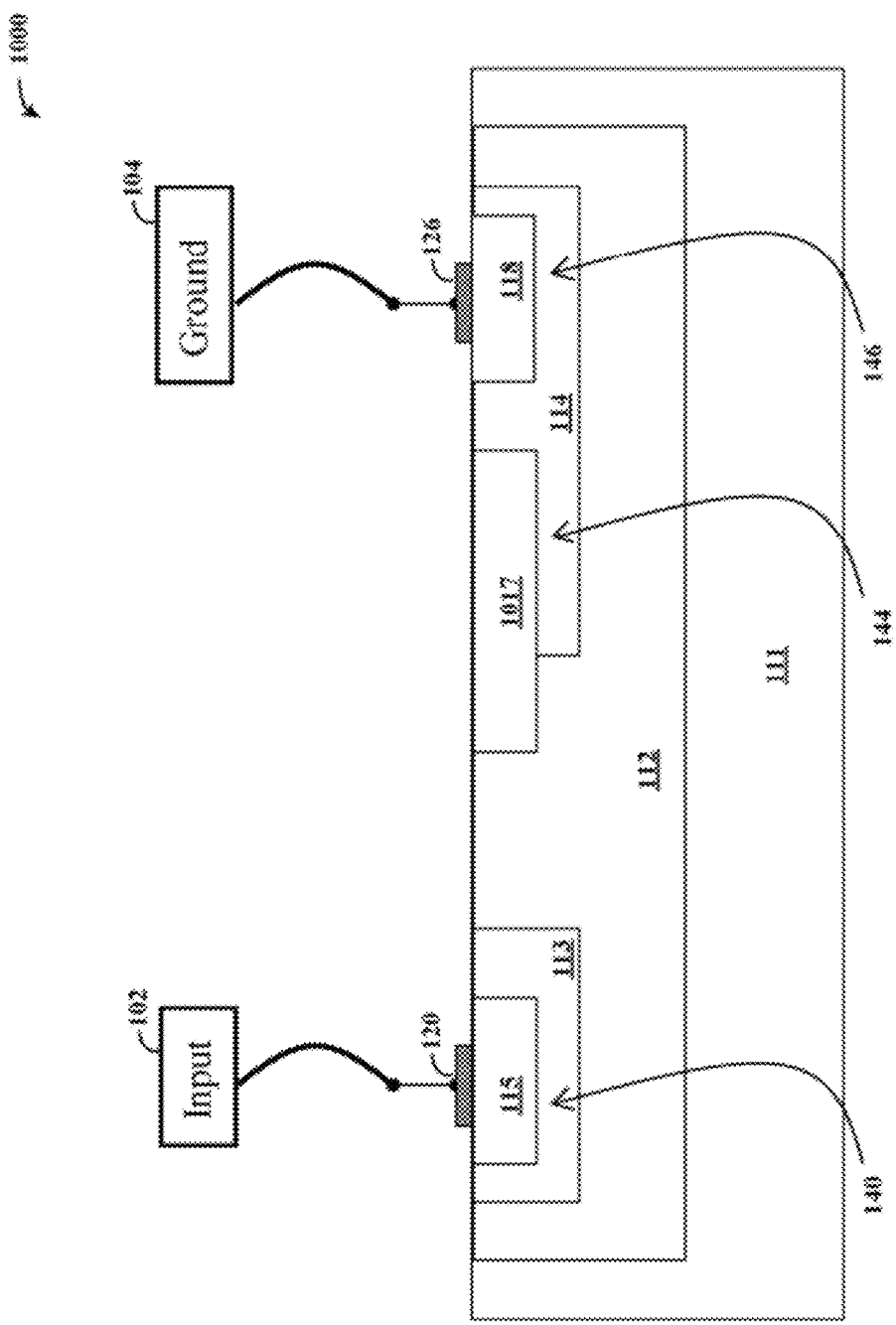
FIG. 10 shows a cross-section of a thyristor-based diode circuit for ESD protection under an ESD condition, according to another example embodiment of the present invention.

FIG. 10 shows a cross-section of a thyristor-based diode circuit 1000 for ESD protection under an ESD condition, according to another example embodiment of the present invention. The circuit 1000 is formed in a manner similar to that as with the circuit 100 in FIG. 1, with similar portions labeled with similar reference numbers and the description thereof omitted for brevity. The emitter 116 in FIG. 1 is no longer present in FIG. 10, and the emitter 117 has been extended beyond base 114 to form emitter 1017 as shown.

Figure 11:
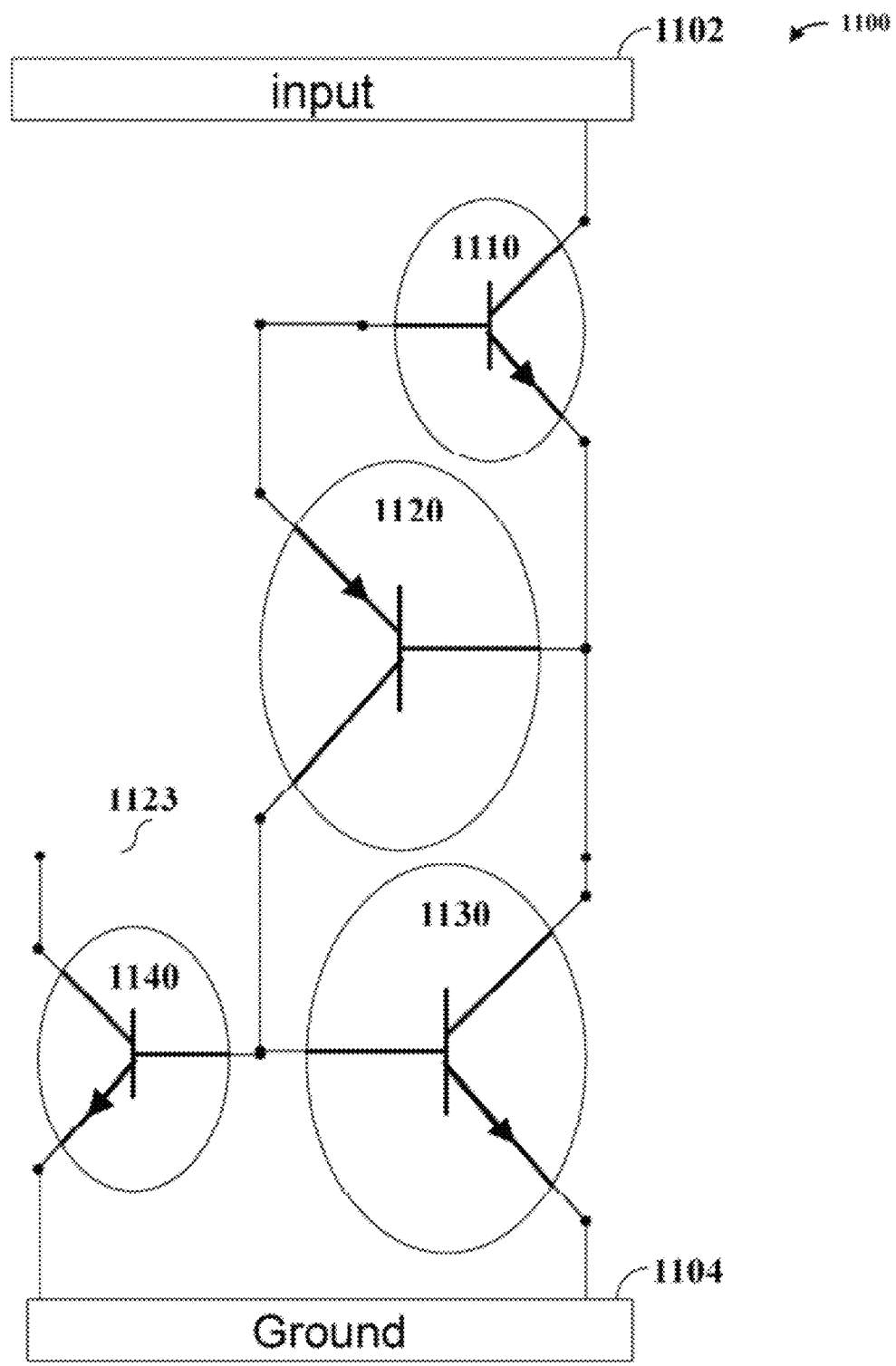
FIG. 11 shows another circuit diagram of an ESD circuit, according to another example embodiment of the present invention.

FIG. 11 shows another ESD circuit 1100, according to another example embodiment of the present invention. The circuit 1100 may, for example, be implemented in connection with the circuit 1000 shown in FIG. 10. The circuit 1100 includes a plurality of transistors 1110, 1120, 1130 and 1140 connected between an input node 1102 and ground 1104. When implemented in accordance with the circuit 1000 shown in FIG. 10, the circuit 1100 is as follows. The collector 112 forms the emitter of transistor 1110, the base of transistor 1120 and the collector of transistor 1130. Base diffusion 113 forms the base of transistor 1110 and the emitter of transistor 1120. Base diffusion 114 forms the collector of transistor 1120 and the base of transistors 1130 and 1140. The emitter 115 forms the collector of transistor 1110, and emitter 1017 forms the collector of transistor 1140. Emitter 118 forms the emitter of transistors 1130 and 1140. Connection 1123 is realized by the overlap of emitter 1017 and collector 112.

Based upon the above discussion and illustrations, those skilled in the art will readily recognize that various modifications and changes may be made to the present invention without strictly following the exemplary embodiments and applications illustrated and described herein. For example, different types of thyristors, arranged to effect the functions herein may be implemented with different orderings of semiconductor material types. Such modifications do not depart from the true spirit and scope of the present invention, including that set forth in the following claims.

What is claimed is:

1. An electrostatic discharge (ESD) circuit comprising:
   in a substrate, a plurality of regions of opposite polarity sharing p-n junctions therebetween, the regions including an input region connected to an internal node susceptible to ESD pulses, an output region connected to ground, and at least one region in series between the input and output regions; and
   an underlying doped region adjacent one of the plurality of regions and configured, in response to a breakdown voltage at one of the junctions, to shunt current between the input region and the output region, bypassing p-n junctions of the regions between the input and output regions.

2. The circuit of claim 1, wherein the underlying doped region is configured to shunt current in response to a breakdown voltage at the input region, wherein the breakdown voltage is characterized relative to a common domain including the output region.

3. The circuit of claim 1, wherein the respective regions are configured to respond to a voltage at the input region that is less than a breakdown threshold for the p-n junction with the input region and an adjacent one of the at least one region in series, to couple leakage current from the input region to the output region by passing current at the internal node through the input region and to the output region via the at least one region in series therebetween.

4. The circuit of claim 1, wherein the input region is configured to respond to an ESD event during which a voltage at the internal node exceeds a breakdown threshold for the input emitter, by shunting current from the input region to the output region by passing current received at the input region to the output region via the underlying doped region.

5. The circuit of claim 1, wherein the respective regions are configured to
   respond to a voltage at the internal node that is less than a breakdown threshold for a junction between the input region and an immediately adjacent one of the at least one region in series, by coupling leakage current from the input region to the output region via p-n junctions between the plurality of regions of opposite polarity, and
   respond to an ESD event during which a voltage at the internal node exceeds a breakdown threshold for the input emitter, by shunting current from the input region to the output region by passing current received at the input region to the output region via the underlying doped region.

6. The circuit of claim 1, further including a conductor that shorts emitter diffusion regions within adjacent base diffusion regions, each of the emitter diffusion regions respectively forming one of the p-n junctions with the base region in which it is formed.

7. The circuit of claim 1, wherein
   the input region and an adjacent one of the regions form a diode having a low breakdown voltage wherein the low breakdown voltage is characterized relative to a common domain including the output region,
   the underlying doped region and the input and output regions form a thyristor, and the diode is configured to shunt the current from the input region to the output region via the thyristor.

8. The circuit of claim 7, wherein
   the diode and the other of the plurality of doped regions are configured and arranged to pass a leakage current between the input region and the output region at voltage levels below the threshold breakdown voltage, and
   the thyristor is configured to shunt the current in response to the diode circuit breaking down.

9. The circuit of claim 1, wherein
   at least one of the plurality of regions forms a trigger diode, and
   at least two of the regions of opposite polarity and the underlying doped region form a diode-triggered bipolar transistor clamping circuit including a resistor and a bipolar transistor that is triggered by the trigger diode to shunt current from the input region to ground.

10. The circuit of claim 1, wherein
    at least one of the plurality of regions forms a trigger diode, and
    at least two of the regions of opposite polarity and the underlying doped region form a silicon-controlled rectifier that is triggered by the trigger diode to shunt current from the input region to ground.

11. An electrostatic discharge (ESD) circuit comprising:
    in a substrate, a collector region doped to a first polarity;

in the collector region, two base regions separated from one another and doped to a polarity that is opposite the polarity of the collector region;

in each base region, two emitter regions doped to the first polarity, the emitter regions including an input emitter in one of the base regions and connected to an input pin and a grounded emitter in the other one of the base regions and connected to ground;

an interconnect that directly connects the emitter regions that are not connected to the input pin or to ground.

12. The circuit of claim 11, wherein the respective emitter and base regions are configured, in response to a voltage at the input emitter that is less than a breakdown threshold for the input emitter, to couple leakage current from the input emitter to the grounded emitter, by passing current received at the input emitter via its base region to the other emitter in the same base region as the input emitter, through the interconnect to an emitter in the other base region, and to the grounded emitter via the other base region.

13. The circuit of claim 11, wherein the respective emitter and base regions are configured, in response to an ESD event during which a voltage at the input emitter that exceeds a breakdown threshold for the input emitter, to shunt current from the input emitter to the grounded emitter by passing current received at the input emitter via its base region to the collector region, and from the collector to the grounded emitter via the other base region.

14. The circuit of claim 11, wherein the respective emitter and base regions are configured to in response to a voltage at the input emitter that is less than a breakdown threshold for the input emitter, to couple leakage current from the input emitter to the grounded emitter, by passing current received at the input emitter via its base region to the other emitter in the same base region as the input emitter, through the interconnect to an emitter in the other base region, and to the grounded emitter via the other base region, and in response to an ESD event during which a voltage at the input emitter that exceeds a breakdown threshold for the input emitter, to shunt current from the input emitter to the grounded emitter by passing current received at the input emitter via its base region to the collector region, and from the collector to the grounded emitter via the other base region.

15. An electrostatic discharge (ESD) circuit for discharging current from an input node susceptible to ESD pulses, the circuit comprising:

a doped substrate;

a diode circuit in the doped substrate and having a threshold breakdown voltage;

in the doped substrate, a plurality of doped regions of opposite polarity that form p-n junctions connected in series with the diode between the input node and ground, the diode and plurality of doped regions being configured to pass a leakage current between the input node and ground at voltage levels below the threshold breakdown voltage; and a thyristor including a portion of the doped substrate and configured to shunt current from the input node to ground, bypassing at least some of the plurality of doped regions, in response to the diode circuit breaking down.

16. The circuit of claim 15, wherein the plurality of doped regions include two emitter regions respectively located in separate doped base regions and connected to one another by a conductor extending over the doped substrate.

17. The circuit of claim 15, wherein the diode is connected to the input node and the thyristor includes a doped region that also forms part of the diode.

18. The circuit of claim 15, wherein the p-n junctions are configured to respectively share the voltage drop between the input node and ground to mitigate leakage current passing via the p-n junctions.

19. The circuit of claim 15, wherein the plurality of doped regions include a collector region, first and second base regions in the collector region, an input emitter region in the first base region and connected to the input node, an output emitter region in the second base region and connected to ground, and an intermediary emitter region in a portion of the second base region and extending out of the second base region and into the collector region.

20. The circuit of claim 15, wherein the thyristor forms part of a silicon-controlled rectifier, and the diode is a trigger diode and configured to trigger the silicon-controlled rectifier to shunt current between the input node and ground in response to an ESD condition.

21. The circuit of claim 15, further including a diode-triggered bipolar transistor clamping circuit including the thyristor and a doped region in the substrate that forms a resistor, and wherein the diode is a trigger diode and configured to trigger the bipolar transistor clamping circuit to shunt current between the input node and ground in response to an ESD condition.

22. An electrostatic discharge (ESD) circuit comprising:

in a substrate, a plurality of regions of opposite polarity sharing p-n junctions therebetween, the regions including an input region connected to an internal node susceptible to ESD pulses, an output region connected to ground, and at least one region in series between the input and output regions, the plurality of regions including two base regions located in a collector region that is doped to a first polarity, the base regions being separated from one another and doped to a polarity that is opposite the polarity of the collector region;

an underlying doped region adjacent one of the plurality of regions and configured, in response to a breakdown voltage at one of the junctions, to shunt current between the input region and the output region, bypassing p-n junctions of the regions between the input and output regions, the input region including an input emitter in one of the base regions and connected to an input pin, the input emitter being doped to the first polarity, and the output region including a grounded emitter in the other one of the base regions and connected to ground, the grounded emitter being doped to the first polarity; and an interconnect that directly connects the emitter regions that are not connected to the input pin or to ground.

23. The circuit of claim 22, wherein the respective emitter and base regions are configured, in response to a voltage at the input emitter that is less than a breakdown threshold for the input emitter, to couple leakage current from the input emitter to the grounded emitter, by passing current received at the input emitter via its base region to the other emitter in the same base region as the input emitter, through the interconnect to an emitter in the other base region, and to the grounded emitter via the other base region, the collector region includes the underlying doped region, and the respective emitter and base regions are configured, in response to an ESD event during which a voltage at the input emitter that exceeds a breakdown threshold for the input emitter, to shunt current from the input emitter to the grounded emitter by passing current received at the input emitter via its base region to the collector region, and from the collector to the grounded emitter via the other base region.

* * * * *